(12) United States Patent
Lee

(10) Patent No.: US 8,509,008 B2
(45) Date of Patent: Aug. 13, 2013

(54) INTERNAL VOLTAGE GENERATOR OF SEMICONDUCTOR MEMORY DEVICE

(75) Inventor: Jae Ho Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 143 days.

(21) Appl. No.: 13/243,490

(22) Filed: Sep. 23, 2011

(65) Prior Publication Data

US 2012/0099388 A1    Apr. 26, 2012

(30) Foreign Application Priority Data

Oct. 26, 2010  (KR) .................. 10-2010-0104858

(51) Int. Cl.
    *G11C 5/14*    (2006.01)
(52) U.S. Cl.
    USPC .................. 365/189.09; 365/189.07; 365/226
(58) Field of Classification Search
    USPC .................. 365/189.07, 189.09, 189.11, 205, 365/208, 226; 363/71, 72, 97, 98, 283
    See application file for complete search history.

(56) References Cited

U.S. PATENT DOCUMENTS

| | | | | |
|---|---|---|---|---|
| 5,519,662 | A | * | 5/1996 | Ishibashi et al. .............. 365/207 |
| 5,835,420 | A | * | 11/1998 | Lee et al. .................. 365/189.09 |
| 5,946,334 | A | * | 8/1999 | Ema et al. .................. 372/38.01 |
| 6,009,022 | A | * | 12/1999 | Lee et al. .................. 365/189.09 |
| 6,906,502 | B2 | * | 6/2005 | Kernahan et al. ............. 323/282 |

FOREIGN PATENT DOCUMENTS

| KR | 1020060122193 A | 11/2006 |
|---|---|---|
| KR | 1020100069819 A | 6/2010 |

* cited by examiner

*Primary Examiner* — Gene Auduong
(74) *Attorney, Agent, or Firm* — William Park & Associates Patent Ltd.

(57) ABSTRACT

An internal voltage generator of a semiconductor memory device includes a proportional to absolute temperature (PTAT) current generator configured to generate a PTAT current having a varying current in proportion to a temperature change, a current control circuit configured to generate an internal current identical with the PTAT current and generate an internal voltage based on the internal current, and an offset circuit configured to control the internal voltage to a set voltage level.

24 Claims, 5 Drawing Sheets

121

122

INTERNAL VOLTAGE GENERATOR OF SEMICONDUCTOR MEMORY DEVICE

CROSS-REFERENCE TO RELATED APPLICATION

Priority to Korean patent application number 10-2010-0104858 filed on Oct. 26, 2010, the entire disclosure of which is incorporated by reference herein, is claimed.

BACKGROUND

Exemplary embodiments relate generally to the internal voltage generator of a semiconductor memory device and, more particularly, to the internal voltage generator of a semiconductor memory device, having a potential changed according to a temperature change.

Recently, the demand for a non-volatile memory device, which retains data stored in the device even in absence of power supply, is increasing.

The nonvolatile memory device can be electrically programmed and erased. According to a known art, a floating gate is interposed between a control gate and a channel of a transistor of a nonvolatile memory cell. Also, according to a known programming mechanism, electrons tunnel through a barrier, e.g., an insulating layer of the floating gate in the presence of a high electric field, and the electrons placed on the floating gate are trapped therein. The electrons of the floating gate would not discharge for long periods of time and shift the threshold voltage of the transistor.

During a program verification operation or a read operation for the nonvolatile memory cells, whether the threshold voltage Vth of the memory cell is above a certain verification voltage or a certain read voltage is determined.

However, the threshold voltage Vth of the memory cell may vary according to temperature, and if the program verification operation or the read operation is performed with a fixed verification voltage or a fixed read voltage, data stored in the memory cell may be read incorrectly. Further, in the case of a multi-level cell (MLC) program method, because distances of each threshold voltage distributions are closer than that of a single-level cell (MLC) program method.

Therefore, the program verification operation or the read operation may be performed with a verification voltage or a read voltage variable according to temperature.

FIG. 1 is a graph illustrating current and voltage characteristics according to temperature, and FIG. 2 shows changes of threshold voltage distributions of memory cells.

Referring to FIGS. 1 and 2, electric characteristics of a semiconductor device, such as an MOS and a BJT, may vary according to temperature. According to a known art, as temperature is lowered within a temperature range above a point where a cold temperature curve and a hot temperature curve meet, the threshold voltage of the MOS transistor increases and the amount of current decreases. However, as temperature is lowered within a temperature range below the point where the cold temperature curve and the hot temperature curve meet, the threshold voltage of the MOS transistor decreases and the amount of current increases. Here, the amount of current at the cold temperature is equal to the amount of current at the hot temperature at the point where the cold temperature curve and the hot temperature curve meet, and the current at the point may be called a zero point current. According to a known art, a sense current used in a nonvolatile memory device is about 100 nA to 200 nA, and the sense current is lower than the zero point current. Accordingly, the threshold voltage distributions of memory cells decrease as temperature increases. Further, in the read operation of the nonvolatile memory device, the threshold voltages of the memory cells may vary according to temperature. Consequently, a probability of occurrence of an error may increase.

BRIEF SUMMARY

Exemplary embodiments relate to the internal voltage generator of a semiconductor memory device for generating an internal voltage, having a varying output potential according to a temperature change, using a current generator for generating current which is proportional to or inversely proportional to a temperature change.

An internal voltage generator of a semiconductor memory device according to an exemplary embodiment of the present disclosure includes a proportional to absolute temperature (PTAT) current generator for generating a PTAT current having a varying current in proportion to a temperature change, a current control circuit for generating an internal current identical with the PTAT current and generating an internal voltage based on the internal current, and an offset circuit for equally controlling the internal voltage.

An internal voltage generator of a semiconductor memory device according to an exemplary embodiment of the present disclosure includes a proportional to absolute temperature (PTAT) current generator for generating a PTAT current having a varying current in proportion to a temperature change, a complementary to absolute temperature (CTAT) current generator for generating a CTAT current having a vary current in inverse proportion to a temperature change, a selector for selecting one of the PTAT current and the CTAT current in response to a control signal, a current control circuit for generating an internal current by copying the PTAT current or the CTAT current selected by the selector and for generating an internal voltage by supplying the internal current to a resistor of an output terminal, and an offset circuit for equally maintaining the internal voltage by controlling the offset voltage of the output terminal according to the copied current.

An internal voltage generator of a semiconductor memory device according to an exemplary embodiment of the present disclosure includes a complementary to absolute temperature (CTAT) current generator for generating a CTAT current having a vary current in inverse proportion to a temperature change, a temperature compensation voltage generator for generating an internal current by copying the CTAT current and generating a varying temperature compensation voltage having the temperature change by supplying the internal current to the resistor of an output terminal, a voltage controller for outputting the temperature compensation voltage as a first output voltage and a step voltage as a second output voltage or outputting the temperature compensation voltage as the second output voltage and the step voltage as the first output voltage, and an internal voltage generator for comparing the first output voltage and the second output voltage and generating an internal voltage by amplifying a result of the comparison.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
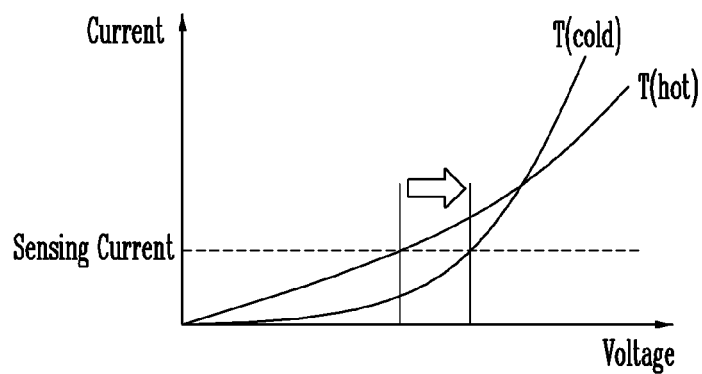
FIG. 1 is a graph illustrating current and voltage characteristics according to temperature.
Figure 2:
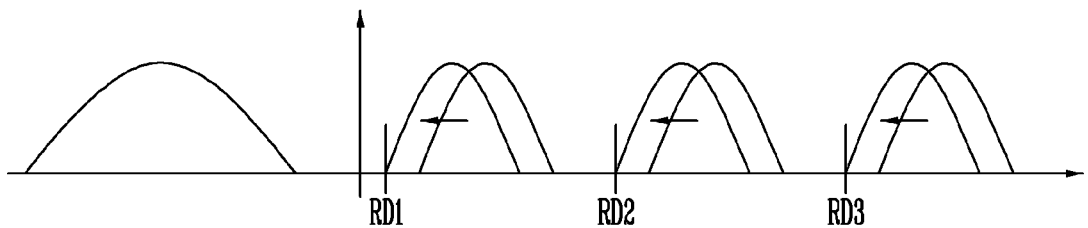
FIG. 2 shows changes of the threshold voltage distributions of memory cells.
Figure 3:
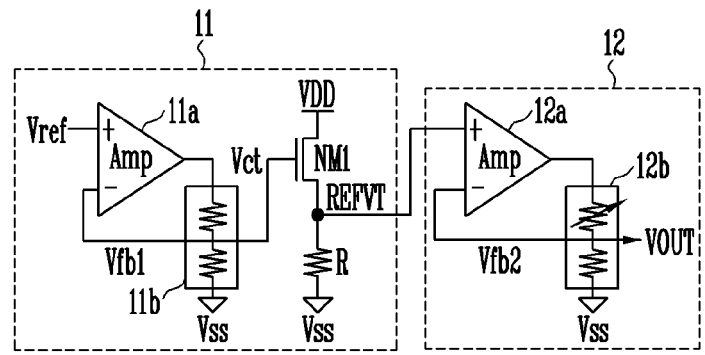
FIG. 3 is a circuit diagram of an exemplary internal voltage generator.

FIG. 3 is a circuit diagram of an exemplary internal voltage generator.

Referring to FIG. 3, the internal voltage generator includes a voltage generator 11 and a temperature compensation controller 12. The voltage generator 11 generates voltage REFVT, varying according to a temperature change, based on a reference voltage Vref which does not vary according to the temperature change. The temperature compensation controller 12 generates an internal voltage VOUT based on the voltage REFVT.

The voltage generator 11 generates a control voltage Vct based on the reference voltage Vref independent of a temperature change and generates the voltage REFVT, dropped from a power supply voltage VDD by a threshold voltage value of an NMOS transistor NM1, by supplying the control voltage Vct to the gate of the NMOS transistor NM1. Since the threshold voltage of the NMOS transistor NM1 varies according to temperature, the voltage REFVT varies according to a temperature change.

The temperature compensation controller 12 controls a shift of voltage according to temperature of the internal voltage VOUT using a variable resistor 12b. For example, assuming that a change of the voltage according to the temperature of the voltage REFVT is 100 mV/100° C., the temperature compensation controller 12 may control the change of the voltage so that it becomes 80 mV/100° C. or 120 mV/100° C.

However, in the semiconductor memory device, not only the threshold voltage of the transistor, but also an output voltage level may vary due to a process skew. This is because the variable resistor 12b used in the temperature compensation controller 12 has a varying resistance value.

Figure 4:
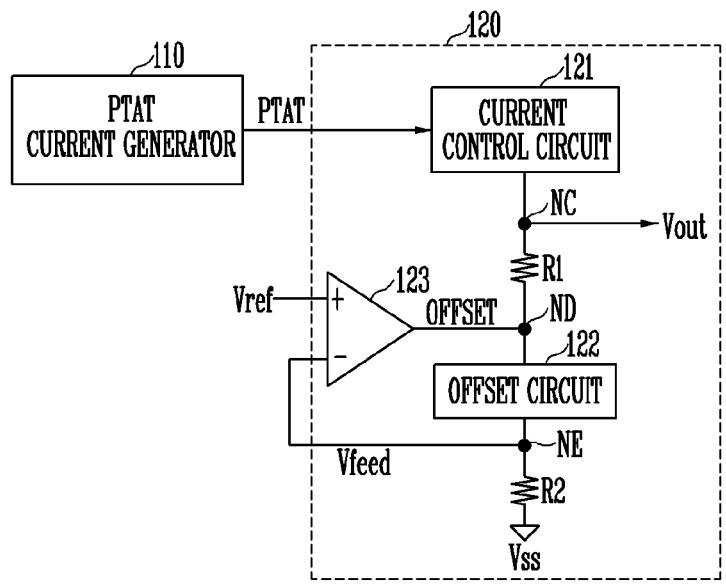
FIG. 4 is a circuit diagram of an internal voltage generator according to an exemplary embodiment of this disclosure.

FIG. 4 is a circuit diagram of an internal voltage generator according to an exemplary embodiment of this disclosure.

Referring to FIG. 4, the internal voltage generator 100 includes a proportional to absolute temperature (PTAT) current generator 110 and an internal voltage generator 120.

The PTAT current generator 110 is a current generator having a PTAT current characteristic. The PTAT current characteristic is a characteristic that the current is proportional to temperature.

The internal voltage generator 120 generates an output voltage VOUT which varies according to a PTAT current PTAT outputted from the PTAT current generator 110. The internal voltage generator 120 includes a current control circuit 121, an offset circuit 122, an operational amplifier 123, and resistors R1 and R2.

The current control circuit 121 copies the PTAT current PTAT of the PTAT current generator 110 and generates a certain voltage by allowing the copied PTAT current to flow through the resistor R1. The output voltage VOUT outputted from a node NC may vary according to the PTAT current.

The offset circuit 122 is coupled between the resistor R1 and the resistor R2 and is configured to generate the output voltage VOUT having, according to an example, a constant level by controlling the output voltage VOUT of the node NC.

The operational amplifier 123 compares a potential of a node NE between the offset circuit 122 and the resistor R2 (that is, a feedback voltage Vfeed divided by the offset circuit 122 and a resistance value of the resistor R2) and the reference voltage Vref not influenced by a temperature change, and supplies an offset voltage OFFSET to a node ND between the resistor R1 and the offset circuit 122.

Accordingly, the potential of the node ND can be controlled according to the operations of the offset circuit 122 and the operational amplifier 123, and thus the output voltage VOUT can be outputted by controlling the potential of the node NC.

Figure 5:
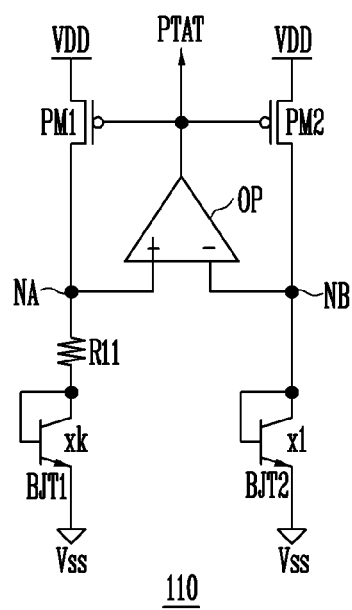
FIG. 5 a circuit diagram of a proportional to absolute temperature (PTAT) current generator shown in FIG. 4.

FIG. 5 a circuit diagram of the PTAT current generator 110 shown in FIG. 4.

Referring to FIG. 5, the PTAT current generator 110 includes a plurality of PMOS transistors PM1 and PM2, an operational amplifier OP, a resistor R11, and a plurality of BJT transistors BJT1 and BJT2.

The PMOS transistor PM1, the resistor R11, and BJT transistor BJT1 are coupled in series between a terminal of a power supply voltage VDD and a terminal of ground voltage VSS. The PMOS transistor PM2 and the BJT transistor BJT2 are coupled in series between the terminal of a power supply voltage VDD and the terminal of ground voltage VSS. The BJT transistors BJT1 and BJT2 are diode-coupled. The size of the BJT transistor BJT1 may be K-times larger than the size of the BJT transistor BJT2. Furthermore, the operational amplifier OP generates the PTAT current PTAT by comparing a potential of the node NA between the PMOS transistor PM1 and the resistor R11 and a potential of the node NB between the PMOS transistor PM2 and the BJT transistor BJT2. The PTAT current PTAT is supplied to the gates of the PMOS transistors PM1 and PM2. Here, the size of the BJT transistor BJT1 may be K-times larger than the size of the BJT transistor BJT2.

In the PTAT current generator 110, the amounts of current, initially flowing through the PMOS transistors PM1 and PM2 according to the PTAT current PTAT of the operational amplifier OP, are the same. When the same current flows, voltages at both terminals of the BJT transistors BJT1 and BJT2 are proportional to the size of the BJT transistors BJT1 and BJT2. As described above, the size of the BJT transistor BJT1 may be K-times larger than the size of the BJT transistor BJT2, and thus voltages supplied to both terminals of the resistor R11 is determined based on the size difference between the BJT transistor BJT1 and the BJT transistor BJT2. A voltage difference ΔV between the voltages supplied to both terminals of the resistor R11 is proportional to temperature and the K value. Accordingly, the amounts of current flowing through the PMOS transistors PM1 and PM2 vary. That is, the amounts of current flowing through the PMOS transistors PM1 and PM2 is proportional to temperature and the ratio K which is a difference between the sizes of the BJT transistors BJT1 and BJT2. Accordingly, the operational amplifier OP generates the PTAT current PTAT having a proportional relationship with temperature.

Figure 6:
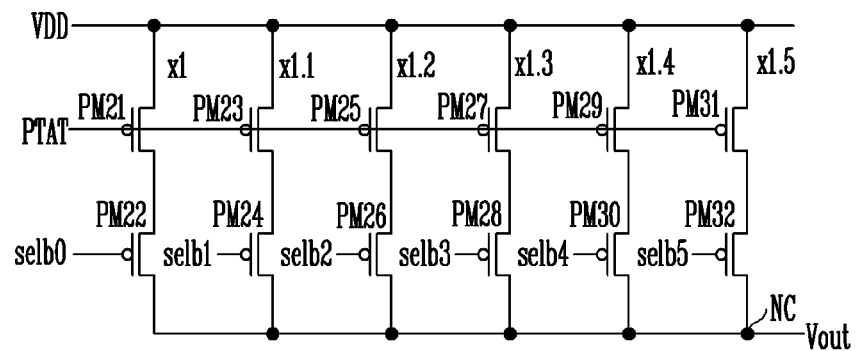
FIG. 6 is a circuit diagram of a current control circuit shown in FIG. 4.

FIG. 6 is a circuit diagram of the current control circuit 121 shown in FIG. 4.

Referring to FIG. 6, the current control circuit 121 copies the received PTAT current PTAT and outputs the copied PTAT current. The current control circuit 121 includes a plurality of PMOS transistors PM21 to PM32.

The PMOS transistors PM21 and PM22 are coupled in series between the terminal of a power supply voltage VDD and an output node NC. The PMOS transistor PM21 is driven in response to the PTAT current PTAT. The PMOS transistor PM22 is driven in response to a selection signal selb0 activated in a low level.

The PMOS transistors PM23 and PM24 are coupled in series between the terminal of a power supply voltage VDD and the output node NC. The PMOS transistor PM23 is driven in response to the PTAT current PTAT. The PMOS transistor PM24 is driven in response to a selection signal selb1 activated in a low level.

The PMOS transistors PM25 and PM26 are coupled in series between the terminal of a power supply voltage VDD and the output node NC. The PMOS transistor PM25 is driven in response to the PTAT current PTAT. The PMOS transistor PM26 driven in response to a selection signal selb2 activated in a low level.

The PMOS transistors PM27 and PM28 are coupled in series between the terminal of a power supply voltage VDD and the output node NC. The PMOS transistor PM27 is driven in response to the PTAT current PTAT. The PMOS transistor PM28 driven in response to a selection signal selb3 activated in a low level.

The PMOS transistors PM29 and PM30 are coupled in series between the terminal of a power supply voltage VDD and the output node NC. The PMOS transistor PM29 is driven in response to the PTAT current PTAT. The PMOS transistor PM30 is driven in response to a selection signal selb4 activated in a low level.

The PMOS transistors PM31 and PM32 are coupled in series between the terminal of a power supply voltage VDD and the output node NC. The PMOS transistor PM31 is driven in response to the PTAT current PTAT. The PMOS transistor PM32 is driven in response to a selection signal selb5 activated in a low level.

The PMOS transistors PM21, PM23, PM25, PM27, PM29, and PM31, driven in response to the PTAT current PTAT, have different sizes. Although the PMOS transistors PM21, PM23, PM25, PM27, PM29, and PM31 are driven in response to the same PTAT current PTAT, the amounts of current flowing through the PMOS transistors PM21, PM23, PM25, PM27, PM29, and PM31 are not the same. Accordingly, the amount of current is controlled in response to one of the selection signals selb0 to selb5 which is activated, and outputted as the output voltage VOUT.

Figure 7:
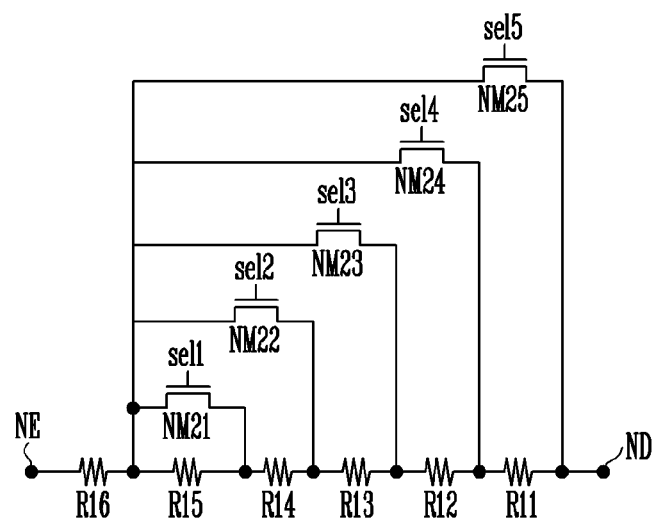
FIG. 7 is a circuit diagram of an offset circuit shown in FIG. 4.

FIG. 7 is a circuit diagram of the offset circuit 122 shown in FIG. 4.

Referring to FIG. 7, the offset circuit 122 includes a plurality of resistors R11 to R16 and a plurality of NMOS transistors NM21 to NM25. The plurality of resistors R11 to R16 are coupled in series between a node ND and a node NE. Each of the plurality of NMOS transistors NM21 to NM25 is coupled between a node, between the resistor R16 and the resistor R15, and each node between two connected resistors R15 to R11 or a node between the resistor R11 and the node ND. The NMOS transistors NM21 to NM25 are driven in response to respective selection signals sel1 to sel5 which are reversed signals of the respective selection signals selb1 to selb5 inputted to the current control circuit 121.

Accordingly, the offset circuit 122 controls a total resistance value between the node ND and the node NE in response to the selection signals sel1 to sel5. That is, the offset circuit 122 controls the potential of the node ND (that is, the offset voltage OFFSET) in response to the selection signals sel1 to sel5 which are reversed signals of the respective selection signals selb0 to selb5 which control the copied PTAT current of the current control circuit 121, so that the output voltage VOUT has a constant output voltage.

According to an exemplary embodiment, the PTAT current PTAT proportional to temperature is copied, an internal voltage is generated using the copied PTAT current, and the potential of the internal voltage is controlled according to the copied PTAT current value. Accordingly, the internal voltage remains constant although the degree of temperature compensation varies.

Figure 8:
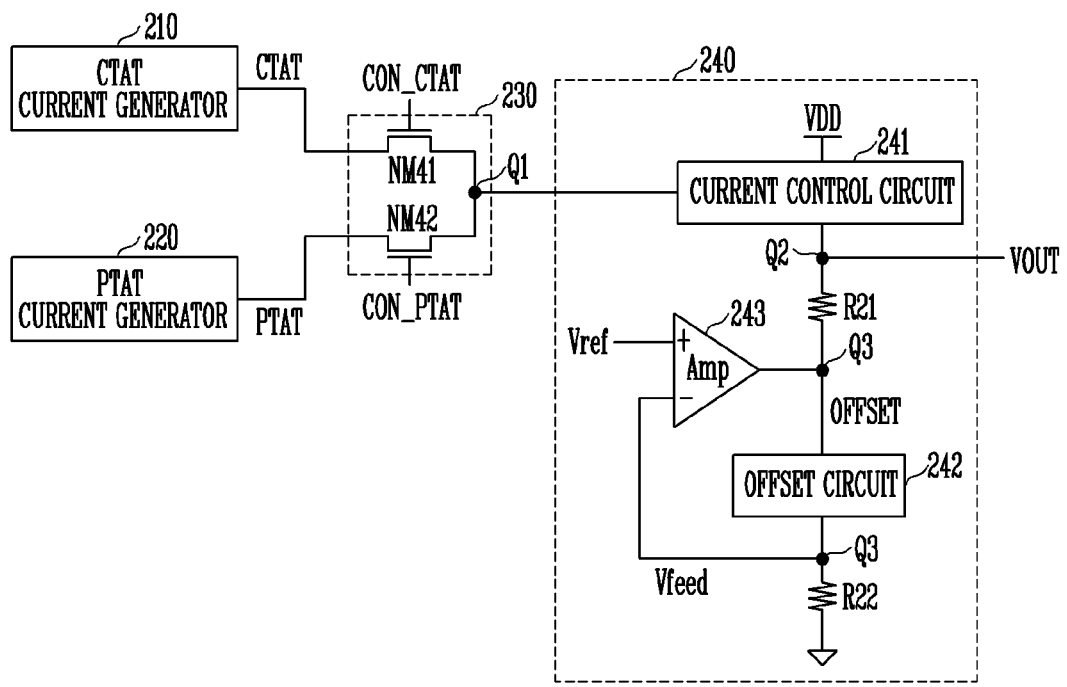
FIG. 8 is a circuit diagram of an internal voltage generator according to an exemplary embodiment of this disclosure.

FIG. 8 is a circuit diagram of an internal voltage generator according to an exemplary embodiment of this disclosure.

Referring to FIG. 8, the internal voltage generator 200 includes a complementary to absolute temperature (CTAT) current generator 210, a PTAT current generator 220, a selector 230 for selecting one of a CTAT current CTAT and a PTAT current PTAT, and an internal voltage generator 240.

The CTAT current generator 210 has a CTAT current characteristic. The CTAT current is inversely proportional to temperature.

The PTAT current generator 220 and the internal voltage generator 240 may have the same configurations and operations as the PTAT current generator and the internal voltage generator according to the exemplary embodiment described above, and a detailed description thereof is omitted.

The selector 230 transmits the CTAT current CTAT, generated by the CTAT current generator 210, or the PTAT current PTAT, generated by the PTAT current generator 220, in response to a first or second control signal CON_CTAT or CON_PTAT to the internal voltage generator 240. That is, in the case where an internal voltage inversely proportional to temperature is generated, the selector 230 transmits the CTAT current CTAT to the internal voltage generator 240 in response to the first control signal CON_CTAT. In the case where an internal voltage proportional to temperature is generated, the selector 230 transmits the PTAT current PTAT to the internal voltage generator 240 in response to the second control signal CON_PTAT.

Accordingly, the internal voltage generator 240 according to an exemplary embodiment can generate an internal voltage inversely proportional to temperature or an internal voltage proportional to temperature, in response to the first or second control signal CON_CTAT or CON_PTAT.

Figure 9:
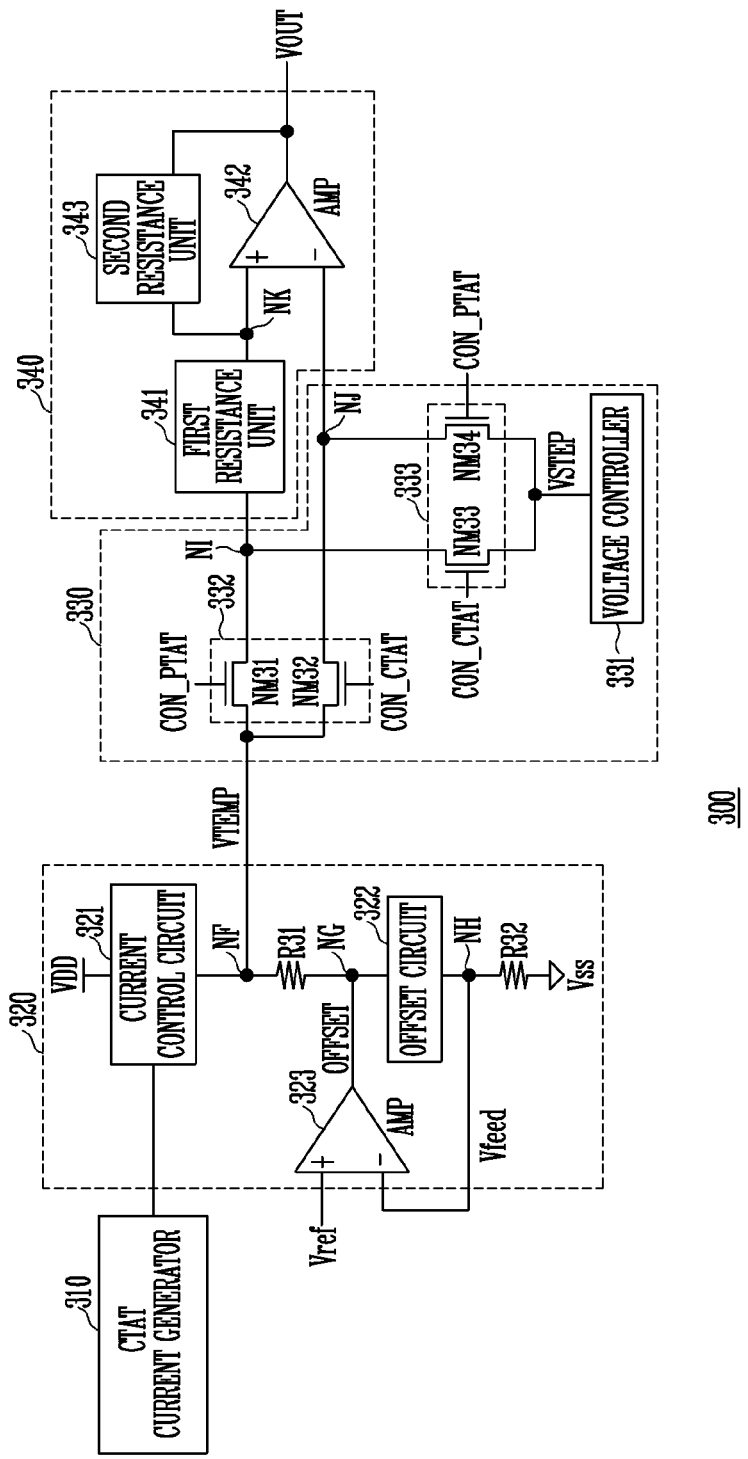
FIG. 9 is a circuit diagram of an internal voltage generator according to an exemplary embodiment of this disclosure.

FIG. 9 is a circuit diagram of an internal voltage generator according to an exemplary embodiment of this disclosure.

Referring to FIG. 9, the internal voltage generator 300 includes a CTAT current generator 310, a compensation voltage generator 320, a voltage controller 330, and an internal voltage generator 340.

The CTAT current generator 310 has a CTAT current characteristic. In an embodiment, although the CTAT current generator is used, the PTAT current generator may be used instead of the CTAT current generator.

The compensation voltage generator 320 may have the same elements and operation as the internal voltage generator of the exemplary embodiment described above, and a detailed description thereof is omitted. The compensation voltage generator 320 generates a temperature compensation voltage VTEMP, reversely proportional to temperature, in response to the CTAT current CTAT generated by the CTAT current generator 310.

The voltage controller 330 outputs the temperature compensation voltage VTEMP to a first output node NI or a second output node NJ in response to a first or second control signal CON_PTAT or CON_CTAT, and outputs the step voltage VSTEP of a voltage controller 331 to the second output node NJ or the first output node NI. That is, when the temperature compensation voltage VTEMP is outputted to the second output node NJ in response to the second control signal CON_CTAT, the step voltage VSTEP of the voltage controller 331 is outputted to the first output node NI.

The voltage controller 330 includes the voltage controller 331, a first switching circuit 332, and a second switching circuit 333.

The voltage controller 331 may include a voltage adder or a voltage subtracter. The first switching circuit 332 includes NMOS transistors NM31 and NM32. The NMOS transistor NM31 transmits the temperature compensation voltage VTEMP to the first output node NI in response to the first control signal CON_PTAT. The NMOS transistor NM32 transmits the temperature compensation voltage VTEMP to the second output node NJ in response to the first control signal CON_CTAT.

The second switching circuit 333 includes NMOS transistors NM33 and NM34. The NMOS transistor NM33 transmits the step voltage VSTEP to the first output node NI in response to the second control signal CON_CTAT. The NMOS transistor NM34 transmits the step voltage VSTEP to the second output node NJ in response to the first control signal CON_PTAT.

The internal voltage generator 340 compares potentials of the first and the second output nodes NI and NJ of the voltage controller 330 and generates an output voltage VOUT by amplifying the potentials.

The internal voltage generator 340 includes first and second resistance units 341 and 343 and an operational amplifier 342. The first and the second resistance units 341 and 343 are coupled between the first output node NI and the output terminal of the operational amplifier 342 and are configured to transmit voltage, divided from the output voltage VOUT, to a node NK coupled to the positive (+) input terminal of the operational amplifier 342. Here, the divided voltage is controlled according to the potential of the first output node NI. The operational amplifier 342 compares the potentials of the node NK and the second output node NJ and generates the output voltage VOUT by comparing the potentials.

The output voltage VOUT of the internal voltage generator 340 is outputted according to voltage supplied to the positive (+) input terminal and the negative (−) input terminal of the operational amplifier 342 having a CTAT current characteristic or a PTAT current PTAT characteristic. For example, when the temperature compensation voltage VTEMP having the CTAT current characteristic is supplied to the positive (+) input terminal of the operational amplifier 342, the output voltage VOUT has the CTAT current characteristic. When the temperature compensation voltage VTEMP having the CTAT current characteristic is supplied to the negative (−) input terminal of the operational amplifier 342, the output voltage VOUT has the PTAT current PTAT characteristic having a reverse relation with the CTAT current characteristic.

According to an embodiment, the temperature compensation voltage VTEMP is generated using current outputted from the CTAT current generator 310 or the PTAT current generator. The internal voltage VOUT according to the CTAT characteristic or the PTAT characteristic can be generated by selectively inputting the temperature compensation voltage VTEMP to the positive (+) or negative (+) input terminal of the operational amplifier 342.

According to the present disclosure, an internal voltage having an output potential varying according to a temperature change is generated using the current generator for generating current proportional to or inversely proportional to a temperature change. Accordingly, threshold voltage distributions of a nonvolatile memory device can be accurately detected because a variation of the output according to a process skew can be minimized.

What is claimed is:

1. An internal voltage generator of a semiconductor memory device, comprising:
 a proportional to absolute temperature (PTAT) current generator configured to generate a PTAT current having a varying current in proportion to a temperature change;
 a current control circuit configured to generate an internal current identical with the PTAT current and generate an internal voltage based on the internal current; and
 an offset circuit configured to control the internal voltage to a set voltage level.

2. The internal voltage generator of claim 1, wherein the PTAT current generator comprises two BJT transistors having different sizes and generates the PTAT current by comparing amounts of path current according to temperatures of the two BJT transistors.

3. The internal voltage generator of claim 1, wherein:
 the current control circuit comprises a plurality of transistors coupled in parallel between a terminal of a power supply voltage and an output terminal, and
 the plurality of transistors generates the internal current, supplied to the output terminal, based on the PTAT current.

4. The internal voltage generator of claim 3, wherein the current control circuit further comprises a plurality of switch elements coupled between the respective transistors and the output terminal and operating in response to respective selection signals.

5. The internal voltage generator of claim 3, wherein the plurality of transistors has different sizes.

6. The internal voltage generator of claim 4, wherein the offset circuit comprises a comparator configured to supply an offset voltage to the output terminal for outputting the internal voltage, wherein the offset voltage is generated by comparing a feedback voltage outputted from an internal node of the offset circuit and a reference voltage not influenced by a temperature change.

7. The internal voltage generator of claim 6, wherein the offset circuit controls the feedback voltage by controlling a resistance value between the output terminal and the internal node in response to the plurality of selection signals.

8. An internal voltage generator of a semiconductor memory device, comprising:
 a proportional to absolute temperature (PTAT) current generator configured to generate a PTAT current having a varying current in proportion to a temperature change;
 a complementary to absolute temperature (CTAT) current generator configured to generate a CTAT current having a vary current in inverse proportion to a temperature change;
 a selector configured to select one of the PTAT current and the CTAT current in response to a control signal;
 a current control circuit configured to generate an internal current by copying the PTAT current or the CTAT current selected by the selector and generate an internal voltage by supplying the internal current to a resistor of an output terminal; and
 an offset circuit configured to control the internal voltage by controlling an offset voltage of the output terminal according to the copied current.

9. The internal voltage generator of claim 8, wherein the PTAT current generator comprises two BJT transistors having different sizes and generates the PTAT current by comparing amounts of path current according to temperatures of the two BJT transistors.

10. The internal voltage generator of claim 8, wherein:
the current control circuit comprises a plurality of transistors coupled in parallel between a terminal of a power supply voltage and the output terminal, and
the plurality of transistors generates the internal current, supplied to the output terminal, based on the PTAT current or the CTAT current.

11. The internal voltage generator of claim 10, wherein the current control circuit further comprises a plurality of switch elements coupled between the respective transistors and the output terminal and operating in response to respective selection signals.

12. The internal voltage generator of claim 10, wherein the plurality of transistors has different sizes.

13. The internal voltage generator of claim 11, wherein the offset circuit comprises a comparator for controlling the offset voltage by comparing a feedback voltage, outputted from an internal node of the offset circuit, and a reference voltage not influenced by a temperature change.

14. The internal voltage generator of claim 13, wherein the offset circuit controls the feedback voltage by controlling a resistance value between the output terminal and the internal node in response to the plurality of selection signals.

15. An internal voltage generator of a semiconductor memory device, comprising:
a complementary to absolute temperature (CTAT) current generator configured to generate a CTAT current having a vary current in inverse proportion to a temperature change;
a temperature compensation voltage generator configured to generate an internal current by copying the CTAT current and generate a varying temperature compensation voltage having the temperature change by supplying the internal current to a resistor of an output terminal;
a voltage controller configured to output the temperature compensation voltage as a first output voltage and a step voltage as a second output voltage or output the temperature compensation voltage as the second output voltage and the step voltage as the first output voltage; and
an internal voltage generator configured to generate an internal voltage having a CTAT current characteristic or a PTAT characteristic according to potentials of the first output voltage and the second output voltage.

16. The internal voltage generator of claim 15, wherein the temperature compensation voltage generator comprises:
a current control circuit configured to generate the internal current by copying the CTAT current and generate the temperature compensation voltage by supplying the internal current to the resistor of the output terminal; and
an offset circuit configured to maintain the temperature compensation voltage by controlling an offset voltage, supplied to the output terminal, according to the copied CTAT current.

17. The internal voltage generator of claim 16, wherein:
the current control circuit comprises a plurality of transistors coupled in parallel between a terminal of a power supply voltage and the output terminal, and
the plurality of transistors generates the internal current, supplied to the output terminal, based on the CTAT current.

18. The internal voltage generator of claim 17, wherein the current control circuit further comprises a plurality of switch elements coupled between the respective transistors and the output terminal and operating in response to respective selection signals.

19. The internal voltage generator of claim 17, wherein the plurality of transistors has different sizes.

20. The internal voltage generator of claim 18, wherein the offset circuit comprises a comparator configured to control the offset voltage by comparing a feedback voltage, outputted from an internal node of the offset circuit, and a reference voltage not influenced by a temperature change.

21. The internal voltage generator of claim 20, wherein the offset circuit controls the feedback voltage by controlling a resistance value between the output terminal and the internal node in response to the plurality of selection signals.

22. The internal voltage generator of claim 15, wherein the voltage controller comprise:
a first selector configured to output the temperature compensation voltage as the first output voltage or the second output voltage in response to a control signal;
a voltage controller configured to generate the step voltage; and
a second selector configured to output the step voltage as the second output voltage or the first output voltage in response to the control signal.

23. The internal voltage generator of claim 22, wherein the voltage controller includes a voltage adder or a voltage subtracter.

24. The internal voltage generator of claim 15, wherein the internal voltage generator comprises an operational amplifier having a positive terminal for receiving the first output voltage and a negative terminal for receiving the second output voltage, wherein the operation amplifier compares the first and the second output voltages and generate the internal voltage by amplifying a result of the comparison.

* * * * *